(12) United States Patent
Volatier et al.

(10) Patent No.: US 7,804,383 B2
(45) Date of Patent: Sep. 28, 2010

(54) COUPLED LAMB WAVE RESONATORS FILTER

(75) Inventors: Alexandre Volatier, Fontaine (FR); Pascal Ancey, Revel (FR); Bertrand Dubus, Ronchin (FR)

(73) Assignee: STMicroelectronics SA, Montrouge (FR)

( * ) Notice: Subject to any disclaimer, the term of this patent is extended or adjusted under 35 U.S.C. 154(b) by 446 days.

(21) Appl. No.: 11/845,268

(22) Filed: Aug. 27, 2007

(65) Prior Publication Data
US 2008/0048804 A1 Feb. 28, 2008

(30) Foreign Application Priority Data
Aug. 28, 2006 (FR) .................................. 06 53488

(51) Int. Cl.
*H03H 9/54* (2006.01)
*H03H 9/56* (2006.01)

(52) U.S. Cl. ....................................... 333/189; 333/191

(58) Field of Classification Search ................. 333/189, 333/141, 145, 147, 190–192
See application file for complete search history.

(56) References Cited

U.S. PATENT DOCUMENTS

| 5,821,833 | A | 10/1998 | Lakin | 333/187 |
| 6,121,856 | A * | 9/2000 | Apostolos | 333/141 |
| 6,720,844 | B1 | 4/2004 | Lakin | 333/189 |
| 2005/0012570 | A1 * | 1/2005 | Korden et al. | 333/189 |
| 2006/0076852 | A1 | 4/2006 | Ruile | 310/313 |
| 2006/0091978 | A1 * | 5/2006 | Wang et al. | 333/189 |
| 2006/0152107 | A1 | 7/2006 | Tanaka | 310/313 |
| 2007/0279153 | A1 * | 12/2007 | Ruby | 333/189 |
| 2008/0297277 | A1 * | 12/2008 | Meister et al. | 333/189 |

FOREIGN PATENT DOCUMENTS

DE 103 25 281 A1 12/2004

OTHER PUBLICATIONS

Bill Drafts; Acoustic Wave Technology Sensors; Oct. 1, 2000.
Ventsislav Yantchev, et al.; Design and Fabrication of Thin Film Lamb Wave Resonators Utilizing Longitudinal Wave and Interdigital Transducers; 2005.
A. Volatier et al; UHF/VHF Resonators Using Lamb Waves Co-integrated with Bulk Acoustic Wave Resonators; 2005.

* cited by examiner

*Primary Examiner*—Robert Pascal
*Assistant Examiner*—Alan Wong
(74) *Attorney, Agent, or Firm*—Lisa K. Jorgenson; Allen, Dyer, Doppelt, Milbrath & Gilchrist, P.A.

(57) ABSTRACT

A coupled Lamb wave resonator filter includes first and second Lamb wave resonators. The first Lamb wave resonator includes a first resonant layer, and first and second electrodes on opposite sides of the first resonant layer. The second Lamb wave resonator includes a second resonant layer, and third and fourth electrodes on opposite sides of the second resonant layer. One of the sides of the first resonant layer belongs to a plane parallel to a plane corresponding to one of the sides of the second resonant layer. Both planes pass through the third and fourth electrodes of the second Lamb wave resonator. A periodic lattice acoustically couples the first and second resonant layers.

33 Claims, 4 Drawing Sheets

COUPLED LAMB WAVE RESONATORS FILTER

FIELD OF THE INVENTION

The invention relates to filters, and more particularly, to coupled resonator filters. Coupled resonator filters may be used in multistandard emission and/or reception architectures, including portable communication devices that can perform mobile communications according to several standards (GSM, GPRS, UMTS, WLAN, etc.) and/or different telephone standards of the 2 G, 2.5 G, 3 G type. Coupled resonator filters may also be used to filter channels or to filter intermediate frequencies.

BACKGROUND OF THE INVENTION

Coupled resonator filters can be made using bent or twisted electromechanical resonators, or electromechanical resonators with bulk waves. In this type of filter, the dimensions of the resonant elements need to decrease as the resonant frequency increases. This causes manufacturing, cost and reliability problems. Furthermore, the input/output impedances of these filters are very high (about several kohms) due to the nature of the detection made (conventionally a capacitance measurement).

BAW (Bulk Acoustic Wave) filters can be made from coupled bulk acoustic wave piezoelectric resonators. The signal to be filtered is propagated vertically in stacked resonant layers, directly or by an acoustic propagation medium, with layers on top of each other. They are called Stacked Crystal Filters (SCF) and Coupled Resonators Filters (CRF).

An example SCF described in U.S. Pat. No. 5,621,833 provides a fairly narrow passband at the output (for example, a passband of about 50 MHz centered around f=1.5 GHz), but too wide for channel filtering (for example, requires a passband of less than 5 MHz). Finally, when it is required to filter at intermediate frequencies, i.e., at frequencies between about 1 MHZ and 500 MHz, the thicknesses necessary for this type of filter become much too large for manufacturing.

An example CRF is described in U.S. Pat. No. 6,720,844. The passband obtained with this type of filter is wider than the passband obtained with an SCF (for example, a passband of about 70 MHz centered around f=1.5 GHz). Therefore, the width of the 4 passband obtained at the output is also too large for channel filtering. The dimensions necessary for this type of filter are also much too large when it is required to filter at intermediate frequencies.

Parasitic wavelengths for which the corresponding frequencies are present in the output spectra of some piezoelectric resonators filters originate from lateral resonances called Lamb waves. Recent work has made it possible to manufacture resonators using these Lamb waves. In particular, these resonators can give a high quality factor Q (about 2000) for a coupling coefficient $K^2$ on the order of 0.8%. Such resonators are described in the publication by A. Volatier, G. Caruyer, and E. Defaÿ, "UHF-VHF Resonators Using Lamb Waves Co-integrated With Bulk Acoustic Wave Resonators", IEEE Ultrasonics Symposium, September 2005.

SUMMARY OF THE INVENTION

In view of the foregoing background, an object of the invention is to provide a narrow passband filter that can be used with intermediate frequencies, such as with channel filtering, for example.

Another object of the invention is to provide a filter that can be directly integrated onto an integrated circuit (above IC integration) to improve performance by reducing losses on filtered signals, and to reduce the costs and size of circuits.

These and other objects, advantages and features in accordance with the invention are provided by a coupled Lamb wave resonator filter comprising at least one first Lamb wave resonator comprising at least a first resonant layer, and at least a first and a second electrode arranged on two opposite faces or sides of the first resonant layer. At least one second Lamb wave resonator comprises at least a second resonant layer, and at least a third electrode and a fourth electrode arranged on two opposite faces or sides of the second resonant layer.

At least one of the faces of the first resonant layer may belong to a plane parallel to one of the faces of the second resonant layer. The face may pass through the two electrodes of the second resonator, or and may pass between the two electrodes of the second resonator or at one of the two electrodes of the second resonator. The second resonator may be arranged adjacent to the first resonator. The first and second resonant layers may be acoustically coupled by acoustic coupling means or by an acoustic coupler.

By arranging and coupling two Lamb wave resonators adjacent to each other, a filter may be made using resonance and propagation of Lamb waves to filter a signal. In particular, the filtering characteristics thus obtained can be used at least for filtering at intermediate frequencies, or for channel filtering.

When Lamb wave resonators are used, a filter can also be integrated directly onto an integrated circuit. One of the faces of each of the two layers may belong to a first plane, and the other of the faces of each of the two layers may belong to a second plane parallel to but distinct from the first plane. Alternatively, the faces may belong to the same plane in pairs.

The first and/or the second resonant layer may be based on a piezoelectric material or an electrostrictive material. In this case, a control voltage can be applied to modulate the resonance of the resonator(s) comprising a resonant layer based on an electrostrictive material. This provides a switching function, with the resonance of these resonators being zero when the control voltage is zero.

At least one electrode of the first resonator can be separated from at least one electrode of the second resonator arranged adjacent to the electrode of the first resonator. The electrodes of the first resonator may be separated, and are not electrically connected to the electrodes in the second resonator.

An electrode in the first resonator can be electrically connected to an electrode in the second resonator. The electrode in the second resonator may be located adjacent the electrode in the first resonator.

The lengths of the first, second, third and/or fourth electrodes can also be equal to about $$\frac{k\lambda_c}{2},$$

where $$f_c = \frac{c}{\lambda_c}$$

is the central frequency of the output spectrum from the coupled Lamb wave resonators filter. The variable c is the acoustic propagation speed of Lamb waves, $\lambda_c$ is the wavelength corresponding to the required central frequency at the filter output, and k is a non-zero natural integer number, such as an odd number, for example.

The length, in this case and throughout the rest of this document, refers to the dimension of a face approximately parallel to the propagation direction of Lamb waves in the resonant layers. Similarly, the lengths of the first and/or the second resonant layer may also be equal to about $$\frac{k\lambda_c}{2}.$$

The lengths of the first and/or second resonant layer may be different from the lengths of the first and/or second and/or third and/or fourth electrodes.

The coupled Lamb wave resonator filters may comprise a single resonant layer forming the portion of resonant acoustic coupling material for the first and the second resonant layers. The acoustic coupling means may comprise at least one portion of the resonant material. The portion of the resonant acoustic coupling material may be arranged between at least two metal areas. The acoustic coupling means may comprise a periodic lattice to increase the passband of the filter.

Furthermore, galvanic isolation may be arranged between the first resonator and the second resonator, for example, to transform a differential signal into a non-differential signal or vice-versa. The electrodes and metal areas on the side of one of the faces of a layer of resonant material can form a single electrode.

The coupled Lamb wave resonator filter can also comprise a third Lamb wave resonator comprising at least a third resonant layer, and at least fifth and sixth electrodes arranged on the two opposite faces of the third resonant layer. The third Lamb wave resonator may be acoustically coupled by acoustic coupling means to the first and/or the second Lamb wave resonator.

The different embodiments described above for the first and second Lamb wave resonators may also be applied to the third resonator in combination with the first and/or the second resonator.

The acoustic coupling means acoustically coupling the third Lamb wave resonator to the first and/or the second Lamb wave resonator may comprise a periodic lattice. The periodic lattice may comprise a portion of the resonant material.

The coupled Lamb wave resonator filter may also include at least a Bragg mirror acoustically coupled to one of the resonators. The resonator may be arranged between the Bragg mirror and another resonator. The Bragg mirror can reduce parasitic resonances present in the output spectrum from the filter related to harmonics in $$\frac{k\lambda}{2},$$

particularly for k=1 or 3.

When the filter comprises at least one Bragg mirror and/or at least one periodic lattice, the resonant material of the Bragg mirror and/or the periodic lattice may comprise alternating parts with high and low acoustic impedance.

The electrodes and/or the metal areas when the filter comprises at least one periodic lattice, located on the side of one of the faces of a layer of resonant material, can all be electrically connected together.

A single resonant layer can form resonant layers of Lamb wave resonators, and when the filter comprises at least one Bragg mirror and/or at least one periodic lattice, the resonant material of the Bragg mirror(s) and/or the periodic lattice(s). Thus, the reliability of the filter can be improved, and its manufacturing can be facilitated using only a single resonant layer.

BRIEF DESCRIPTION OF THE DRAWINGS

This invention will be better understood after reading the description of example embodiments given purely for guidance and are not to be limiting, with reference to the appended figures, wherein.

DETAILED DESCRIPTION OF THE PREFERRED EMBODIMENTS

Identical, similar or equivalent parts of the different figures described below have the same reference numbers so as to facilitate reference from one figure to the next. The different parts shown in the figures are not necessarily at the same scale to make the figures more easily readable. The various variations and embodiments are not exclusive from each other, and can be combined together.

Figure 1:
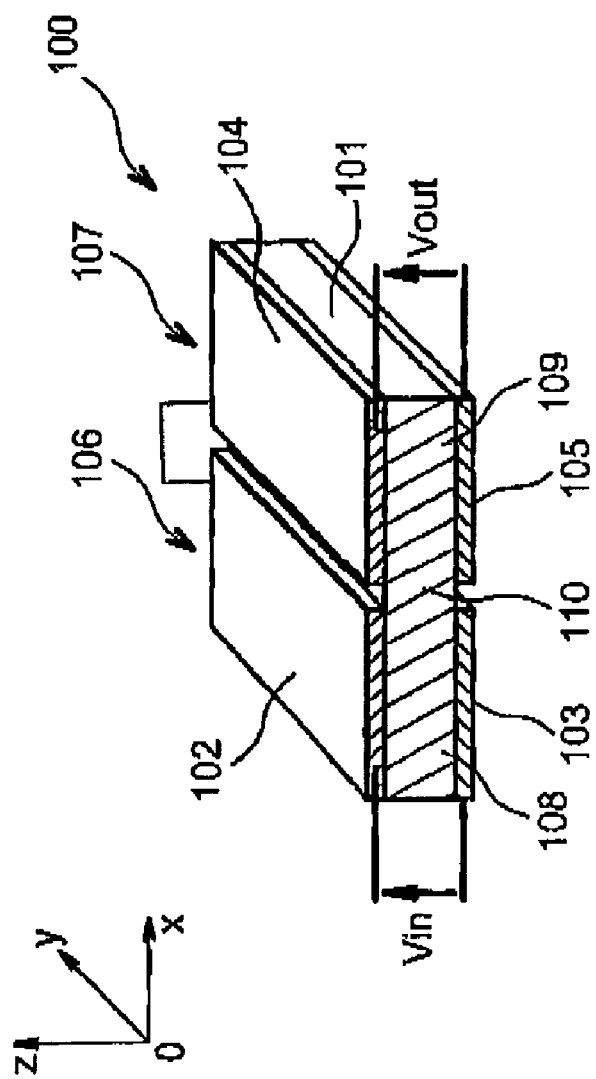
FIG. 1 is a cross-sectional perspective view of a filter with coupled Lamb wave resonators according to a first embodiment of the invention.

Referring first to FIG. 1, a coupled Lamb wave resonator filter 100 according to a first embodiment is shown. In the following description, the coupled Lamb wave resonator filter 100 is described without a periodic lattice between its resonators.

The coupled Lamb wave resonator filter 100 comprises a resonant layer 101 that may be based on a piezoelectric material such as aluminium nitride and/or zinc oxide or even PZT. Two electrodes 102 and 104 are arranged adjacent to each other on the resonant layer 101. In FIG. 1, these two electrodes 102 and 104 are separated from each other. Two other electrodes 103 and 105 are arranged adjacent to each other under the resonant layer 101. These other two electrodes 103 and 105 are also separated from each other. In FIG. 1, all electrodes 102 to 105 have the same length and are aligned vertically in pairs, and can be made conventionally, for example based on platinum, aluminium, molybdenum and/or tungsten.

At least one of the faces of the first resonant layer may belong to a plane parallel to one of the faces of the second resonant layer. The face may pass through the two electrodes of the second resonator, or and may pass between the two electrodes of the second resonator or at one of the two electrodes of the second resonator. The second resonator may be arranged adjacent to the first resonator. The first and second resonant layers may be acoustically coupled by acoustic coupling means or by an acoustic coupler. When Lamb wave resonators are used, a filter can also be integrated directly onto an integrated circuit. One of the faces of each of the two layers may belong to a first plane, and the other of the faces of each of the two layers may belong to a second plane parallel to but distinct from the first plane. Alternatively, the faces may belong to the same plane in pairs. FIG. 1 illustrates both planes passing between the two electrodes 104 and 105.

A part 108 of the resonant layer 101 located between the two electrodes 102 and 103, called the first and second electrodes respectively, form a first Lamb wave resonator 106. Similarly, a part 109 of the resonant layer 101 located between the other two electrodes 104 and 105, called the third and fourth electrodes respectively, form a second Lamb wave resonator 107. A portion 110 of the resonant layer 101 between the two parts 108 and 109 of the resonant layer 101 provides acoustic coupling between the two Lamb wave resonators 106 and 107.

An input signal Vin, i.e., the signal to be filtered, is applied differentially as shown in FIG. 1, or non-differentially (single) by connecting the electrode 103 at a common reference potential (e.g., ground) to the terminals of the first and second electrodes 102, 103 of the first Lamb wave resonator 106. This signal then causes the resonant layers 108 and 109 to start resonating. This resonance results in propagation of Lamb waves along the entire length of the layer 101, thus filtering the signal.

Symmetric Lamb waves of mode $S_0$ contribute mainly to obtain the filtered signal. The filtered signal Vout is then recovered differentially between the electrodes 104 and 105 of the second Lamb wave resonator 107 as shown in FIG. 1, or non-differentially by connecting the electrode 105 to a reference potential.

In this first embodiment, the coupled Lamb wave resonators filter 100 is made to obtain a narrow passband at the output centered around a central frequency equal to about $$f_c = \frac{c}{\lambda_c}.$$

For example, in aluminium nitride $f_c$ is between about 100 MHz and 300 MHz, and $c \approx 10000$ m·s$^{-1}$ for a symmetric Lamb wave of mode $S_0$. When the central frequency goes outside this frequency range, the velocity c decreases due to frequency dispersion. This is done by sizing the two resonators 106, 107 such that the length of each is equal to about $$\frac{\lambda_c}{2}$$

for a central frequency $f_c$. Thus, the lateral resonances of Lamb waves having a length equal to about $\lambda_c$ are used to obtain a principal resonance with frequency $f_c$. More generally, the resonator lengths 106 and 107, in other words the lengths of electrodes 102 to 105 and/or resonant layers 108 and 109 along the x axis in FIG. 1, can be equal to about $$\frac{k\lambda_c}{2},$$

where k is a non-zero natural integer number. The variable k is preferably odd.

In this first embodiment, the space between the two resonators 106 and 107, in other words the length of the portion of resonant material 110 making up the acoustic coupling between the two resonators 106 and 107, is minimized or reduced as much as possible to obtain the best possible precision on the central frequency $f_c$ of the passband obtained at the output. For example, a passband of about 1 MHz to 2 MHz is obtained for a frequency $f_c$=100 MHz. This passband obtained is much narrower than that obtained, for example, with a CRF or SCF device according to the prior art. The result is parasitic resonance at frequencies $$\frac{f_c}{2} \text{ and } \frac{3}{2}f_c$$

in the spectrum obtained at the output. This is due to resonance over the total length of the filter (resonators 106 and 107)

$$\text{at } \frac{\lambda}{2} \text{ and } \frac{3\lambda}{2},$$

respectively.

The first step in making the coupled Lamb wave resonators filter 100 according to the first embodiment is to deposit metal such as aluminium, platinum, molybdenum and/or tungsten on the two faces of the layer 101 of resonant material that will hold the electrodes 102 to 105. The deposition may be by PVD deposition, for example. The next step is to etch metallic deposits made, for example by plasma etching, so as to form two electrodes 102, 104 and 103, 105 on each face of the layer 101. In this first embodiment, the electrodes 102 to 105 extend over the entire width of the layer 101 along the y axis, as illustrated in FIG. 1. This embodiment may be implemented by surface micromachining on a substrate, or by directly etching the inside of the substrate (bulk micromachining).

The width of the resonators, in other words the dimension of the resonators along the y axis in FIG. 1, does not have any influence on the filtering achieved in regards to the central frequency $f_c$ or on the passband obtained. On the other hand, the width of the resonators has an influence on the input and output impedances of the resonators. This impedance depends on the value of the capacitance C of the resonator according to the relation $$Z \approx \frac{1}{2\pi C f_c}$$

where $$C = \frac{\varepsilon \cdot S}{e},$$

and $\in$ is the dielectric constant of the resonant material, e is the thickness of the resonant layer, and S is the surface area of the resonance layer in the (x,y) plane in FIG. 1. Therefore, with an appropriate choice of the width of the resonators, it is possible to choose the value of the impedance of the resonators, and therefore, the impedance of the filter.

In one variation of the first embodiment, it is possible that one electrode in each of the resonators 106 and 107 is adjacent to the other. For example, the second and fourth electrodes 103 and 105 are electrically connected to each other, thus forming only a single electrode. This variation can give an output signal for which the reference potential is similar to the reference potential of the input signal.

It is also possible to use a resonant material other than a piezoelectric material. For example, it is possible that the resonant layer 101 is based on an electrostrictive material, for example such as a BST (Barium Strontium Titanate) type material, strontium and barium titanate, strontium titanate, Rochelle Salt, PMN-PT, PST-PT, PSN-PT, PZN-PT and/or electrostrictive polymers. In this case, a DC control voltage is applied to the terminals of the resonator(s) based on an electrostrictive material. When the control voltage is zero, the signal obtained at the output is zero because resonance of the electrostrictive material is zero. When a non-zero control voltage is applied, coupling of the resonance is then proportional to this control voltage. In particular, this characteristic can be used to adjust resonance so as to refine the passband obtained on the output and add a switching function to the filter.

A single layer may be used to make the coupled Lamb wave resonators filter 100. Furthermore, the first layer 108, the second layer 109 and the portion of resonant material 110 forming the coupling between the two layers 108, 109 can have different acoustic impedance and/or be based on a different material so as to achieve the required coupling between the two resonators 106 and 107.

Figure 2:
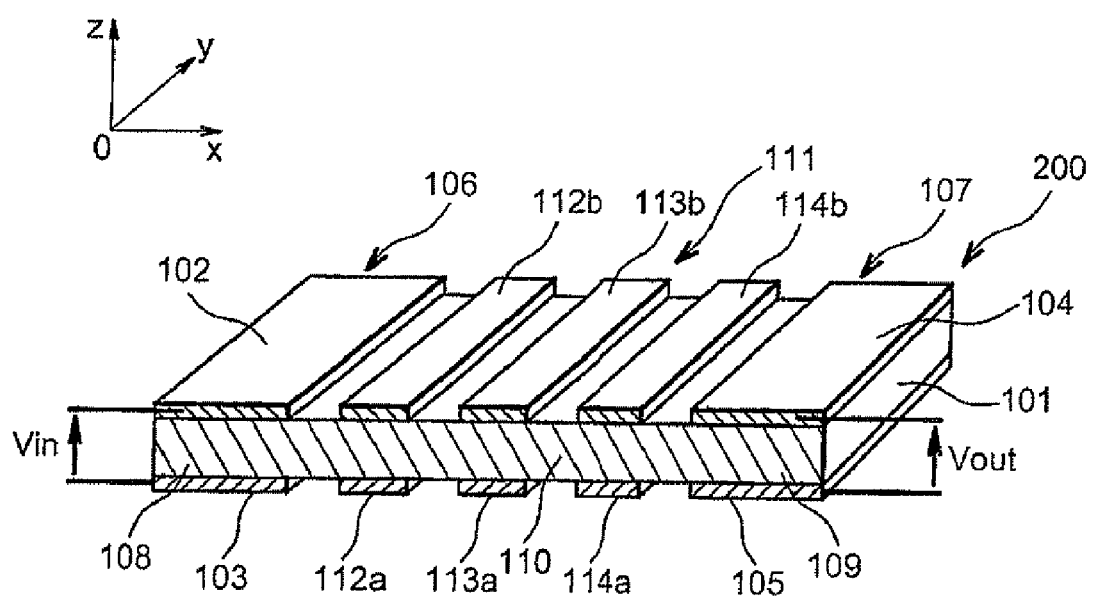
FIG. 2 is a cross-sectional perspective view of a filter with coupled Lamb wave resonators according to a second embodiment of the invention.

Referring now to FIG. 2, a coupled Lamb wave resonators filter 200 according to second embodiment is illustrated. In a similar manner to the first embodiment, this filter 200 comprises two Lamb wave resonators 106 and 107 similar to those shown in FIG. 1. Each of the resonators 106 and 107 comprises a layer of resonant material, 108 and 109 respectively, that can be formed by a single layer 101 as shown in FIG. 2. In this case, the two Lamb wave resonators 106 and 107 are acoustically coupled by a periodic lattice 111. This periodic lattice 111 comprises a portion 110 of the layer 101 of resonant material. The use of a single layer of resonant material 101 to make the filter 200 can improve the reliability and facilitate manufacturing.

In this second embodiment, the coupled Lamb wave resonators filter 200 is made to obtain a narrow passband at the output centered around a central frequency equal to about $$f_c = \frac{c}{\lambda_c}.$$

In this case, the length of the layer of resonant material 101 is equal to about $$\frac{11\lambda_c}{4}.$$

As in the first embodiment, the length of each resonator 106, 107 is about $$\frac{\lambda_c}{2}.$$

Therefore, in this case the length of the portion of resonant material 110 of the periodic lattice 111 is equal to about $$\frac{7\lambda_c}{4}.$$

The periodic lattice 111 comprises a first pair of metal areas 112a, 112b arranged above and below the portion of resonant material 110, and are vertically aligned with each other. These metal areas 112a, 112b are arranged at a distance of about $$\frac{\lambda_c}{4}$$

from the first resonator 106. A second pair of metal areas 113a, 113b, similar to the first pair of metal areas 112a, 112b, is arranged at a distance of about $$\frac{\lambda_c}{4}$$

from the first pair of metal areas 112a, 112b. Finally, a third pair of metal areas 114a, 114b, also similar to the first pair of metal areas 112a, 112b, is arranged at a distance of about $$\frac{\lambda_c}{4}$$

from the second pair of metal areas 113a, 113b and the second resonator 107.

Therefore, the periodic lattice 111 alternately comprises portions of resonant material with a length of about $$\frac{\lambda_c}{4}$$

without metal areas and portions of resonant material with a length of about $$\frac{\lambda_c}{4}$$

arranged between metal areas, themselves with a length of about $$\frac{\lambda_c}{4}.$$

In this case, the metal areas extend over the entire width of the layer of resonant material 101.

In general, the length of the portion of resonant material 110 of the periodic lattice 111 may be equal to about $$\frac{(2m+1)\lambda_c}{4},$$

where $$f_c = \frac{c}{\lambda_c}$$

is the central frequency of the output spectrum from the coupled Lamb wave resonators filter 200. The portion of resonant material 110 is arranged between m pairs of metal areas 112a, 112b, 113a, 113b, 114a, 114b with a length of about $$\frac{\lambda_c}{4}.$$

The two metal areas of each of the pairs are aligned one above the other. The metal areas 112a, 112b, 113a, 113b, 114a, 114b located on the same face of the portion of resonant material 110 are separated from each other and/or an electrode 102, 103, 104, 105 of one of the resonators 106, 107 by a distance equal to about $$\frac{\lambda_c}{4},$$

where m is a natural non-zero integer number. Thus, a periodic pattern of the lattice 111 can be defined as being a portion of resonant material with a length of about $$\frac{\lambda_c}{2}$$

on which a pair of metal areas with a length of about $$\frac{\lambda_c}{4}$$

is placed at one end.

Thus, by modifying the number of patterns in the periodic lattice 111, the coupling made between the two resonators 106 and 107 is modified. The result at the output is therefore a different passband depending on the total length of the layer of resonant material 101 produced. In the example in FIG. 2, the total length of the layer 101 is approximately $$\frac{11\lambda_c}{4}$$

and therefore it comprises three patterns like those defined above.

Use of the periodic lattice 111 enables an increase in the passband obtained at the filter output. The result is then a passband at the output between about 2 MHz and 3 MHZ at a frequency $f_c$=100 MHz. A coupling can also be made with a layer 101 with a length of about $$\frac{9\lambda_c}{4}.$$

The impedance of the filter depends on the surface area of the resonant layer in the (x,y) plane as defined in FIG. 2. In other words, the impedance depends on the width of the filter including the dimension along the y axis as shown in FIG. 2. Therefore, it will be possible to adapt the width of the periodic lattice 111 as a function of the required impedance.

The signal applied to the input on the first resonator 106, and the signal obtained at the output on the second resonator 107 may or may not be differential. This depends on whether an electrode of the first and/or the second resonator 106, 107 is connected to a reference potential, such as a ground. It is possible to convert a differential signal into a non-differential signal, or a non-differential signal into a differential signal, through the galvanic isolation made between the input and output of the filter 200.

An example embodiment of this filter 200 according to the second embodiment will now be given. A metal deposit is made, for example aluminium, platinum, molybdenum and/or tungsten on the two faces of the layer 101 of the resonant material. This may be by PVD deposition. The next step is plasma etching of metallic deposits so as to form two electrodes 102, 104 and 103, 105 on each of the faces of the layer 101, and the metal areas 112 to 114 to form the periodic lattice 111 as shown in FIG. 2. This embodiment may be implemented by surface micromachining on a substrate or by bulk micromachining.

In a variation of the second embodiment, the portion of the resonant material 110 of the periodic lattice 111 may comprise alternating parts with high and low acoustic impedance. Thus, coupling achieved between the two resonators 106 and 107 is further improved, and the passband obtained at the output from the filter 200 can be adjusted.

It is also possible for the electrodes and metal areas of the same face of the layer of resonant material 101, for example electrodes 103, 105 and metal areas 112a, 113a and 114a located below the layer of resonant material 101, to form a single electrode. This variation can be used to obtain an output signal for which the reference potential is similar to the reference potential of the input signal.

Figure 3:
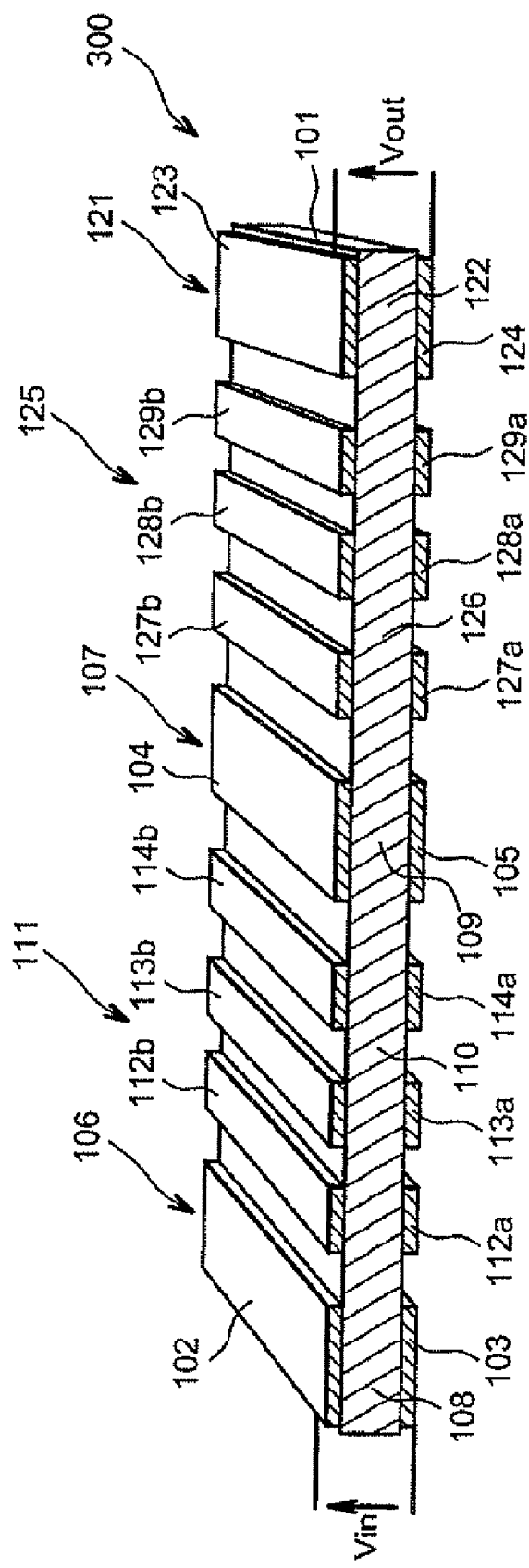
FIG. 3 is a cross-sectional perspective view of a filter with coupled Lamb wave resonators according to a third embodiment of the invention.

It is also possible to use periodic lattices to acoustically couple more than two resonators. FIG. 3 shows a coupled Lamb wave resonator 300 according to a third embodiment.

This filter 300 comprises a first Lamb wave resonator 106 coupled to a second Lamb wave resonator 107 by a first periodic lattice 111. These three elements may be similar to the elements shown in FIG. 2. The filter 300 also comprises a third Lamb wave resonator 121 comprising a resonant layer 122 arranged between two electrodes 123, 124 in a manner similar to the two other resonators 106, 107. The second and third resonators 107 and 121 are acoustically coupled through a second periodic lattice 125, for example similar to the first periodic lattice 111. The second periodic lattice 125 comprises a layer of resonant material 126 arranged between a plurality of pairs of metal areas 127 to 129 arranged on the layer 126 in a manner similar to the metal areas 112 to 114 on the layer 110.

In this embodiment, the layers 108, 109, 110, 122 and 126 of the resonant material are formed by a single layer 101 as shown in FIG. 3. But each of these layers may also have a different nature (material, dimensions, etc.). For example, these resonant layers may be made based on a piezoelectric or electrostrictive material as explained above. Similarly, the materials and dimensions of the electrodes and metallizations on the filter 300 may be similar to the examples given above for the other embodiments. Finally, this filter 300 may be made using techniques similar to the techniques used to make filters in the previous embodiments.

Compared with the second embodiment, the addition of the third resonator can increase selectivity of the filter obtained by increasing the number of poles. A filter can be made comprising more than three Lamb wave resonators, for example acoustically coupled by periodic lattices to obtain an even greater selectivity.

The portion of resonant material 126 in the periodic lattice 125 may comprise alternating parts with high and low acoustic impedance. Thus, the coupling made between the two resonators 107 and 121 is further improved, and the passband obtained at the output from the filter 300 can be adjusted.

It is also possible that the electrodes and metal areas located on the same face of the layer of resonant material 101, for example electrodes 103, 105, 124 and metal areas 112*a*, 113*a*, 114*a*, 127*a*, 128*a* and 129*a* located below the layer of resonant material 101 form a single electrode. This variation can result in an output signal for which the reference potential is similar to the reference potential of the input signal.

Figure 4:
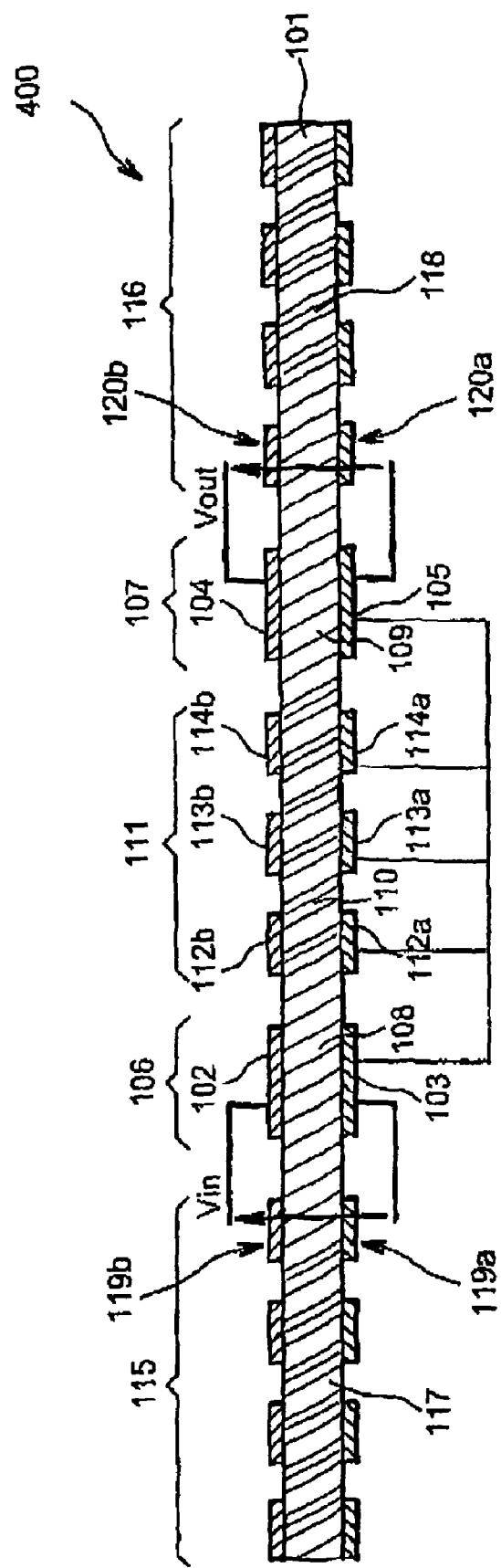
FIG. 4 is a cross-sectional perspective view of a filter with coupled Lamb wave resonators according to a fourth embodiment of the invention.

FIG. 4 shows a coupled Lamb wave resonator filter 400 according to a fourth embodiment. In this example embodiment, the filter 400 comprises the same elements as the filter 200 according to the second embodiment: the two resonators 106 and 107 and the periodic coupling lattice 111.

The coupled Lamb wave resonator filter 400 is similar to the coupled Lamb wave resonators filter 200 in FIG. 2, but also comprises two Bragg mirrors 115 and 116 at its two ends at a distance of approximately $$\frac{\lambda_c}{4}$$

from each of the resonators 106 and 107. Once again, $$f_c = \frac{c}{\lambda_c}$$

is the central frequency of the output spectrum from the coupled Lamb wave resonators filter 400.

Each of the Bragg mirrors 115 and 116 comprises a layer based on a resonant material 117 and 118, respectively. In the example in FIG. 4, these layers 117 and 118 are part of the layer of the resonant material 101. Therefore, a single layer 101 is used to make the resonators 106 and 107 in the periodic coupling lattice 111 and the Bragg mirrors 115 and 116, thus obtaining good reliability of the filter 400.

In the same way as the periodic lattice 111, each Bragg mirror 115, 116 alternately comprises portions of resonant material with a length of about $$\frac{\lambda_c}{4}$$

located between the metal areas. For example, this includes the metal areas 119*a*, 119*b*, 120*a* and 120*b* shown in FIG. 4, and the portions of the resonant material with a length of about $$\frac{\lambda_c}{4}$$

without a metal area. Thus, a propagation medium can be created with an alternating high and low acoustic impedance.

Once again, the metal areas 119*a*, 119*b*, 120*a*, 120*b* of the Bragg mirrors 115 and 116 extend over the entire width of the layer 101 of the resonant material. The Bragg mirrors 115, 116 can reflect signals with a certain wavelength, for example the signals required at the output, but also can reduce parasitic resonances related to the $$\frac{\lambda}{2} \text{ and } \frac{3\lambda}{2}$$

harmonics by dissipating them in the layer of resonant material 101. In this example, these mirrors 115 and 116 can eliminate parasitic frequencies equal to about $$\frac{f_c}{2} \text{ and } \frac{3f_c}{2}$$

located in the output spectrum. For example, the length of each of these Bragg mirrors 115, 116 may be equal to about $$\frac{13\lambda_c}{4} \text{ or } \frac{15\lambda_c}{4}.$$

In general, a Bragg mirror 115, 116 may comprise at least one layer of resonant material 117, 118 with a length equal to about $$\frac{n\lambda_c}{4}.$$

The layer of resonant material 117, 118 is arranged between n pairs of metal areas 119*a*, 119*b*, 120*a*, 120*b* with a length of about $$\frac{\lambda_c}{4}.$$

The two metal areas of each of the pairs are aligned one above the other. The metal areas located on the same face of the layer of resonant material are separated from each other and/or from an electrode of one of the resonators by a distance equal to about $$\frac{\lambda_c}{4},$$

where n is a non-zero natural integer number.

One example embodiment of this filter 400 according to the fourth embodiment will now be given. A metal deposit is made, for example such as aluminium, platinum, molybdenum and/or tungsten on the two faces of the layer 101 of the resonant material. This may be by PVD deposition. The next step is to etch the metallic deposits, for example by plasma etching, so as to form two electrodes 102, 104 and 103, 105 on each of the faces of the layer 101, the metal areas 112 to 114 to form the period lattice 111, and the metal areas of the Bragg mirrors 115 and 116 as shown in FIG. 4. This embodiment may be implemented by surface micromachining on a substrate or by bulk micromachining.

In one variation of the fourth embodiment, the portions of the resonant material 117 and 118 of the Bragg mirrors 115 and 116 may comprise alternating parts with high and low acoustic impedances so as to adjust the reflection and dissipation properties of the Bragg mirrors 115 and 116.

In all four embodiments described, each electrode extends over the entire face of the resonant layer of the resonator on which it is located. It would also be possible for one or several electrodes to be made differently, without covering the entire faces of the resonant layers on which they are located.

That which is claimed:

1. A coupled Lamb wave resonator filter comprising:
   at least one first Lamb wave resonator comprising a first resonant layer, and first and second electrodes on opposite sides of said first resonant layer;
   at least one second Lamb wave resonator comprising a second resonant layer, and third and fourth electrodes on opposite sides of said second resonant layer;
   at least one of the sides of said first resonant layer belonging to a plane parallel to a plane corresponding to one of the sides of said second resonant layer, with both planes passing between said third and fourth electrodes of said second Lamb wave resonator; and
   a periodic lattice acoustically coupling said first and second resonant layers.

2. A coupled Lamb wave resonator filter according to claim 1, wherein one of the sides of each of said first and second resonant layers belongs to a first plane, and the other of the sides of each of said first and second resonant layers belongs to a second plane parallel to but distinct from the first plane.

3. A coupled Lamb wave resonator filter according to claim 1, wherein at least one of said first and second resonant layers comprises one of a piezoelectric material and an electrostrictive material.

4. A coupled Lamb wave resonator filter according to claim 1, wherein said first and second electrodes of said first Lamb wave resonator are separated, and are not electrically connected to said third and fourth electrodes of said second Lamb wave resonator.

5. A coupled Lamb wave resonator filter according to claim 1, wherein one of said first and second electrodes of said first Lamb wave resonator is electrically connected to one of said third and fourth electrodes of said second Lamb wave resonator.

6. A coupled Lamb wave resonator filter according to claim 1, wherein a length of at least one of said first, second, third and fourth electrodes is equal to about $$\frac{k\lambda_c}{2},$$

where $$f_c = \frac{c}{\lambda_c}$$

is a central frequency of an output spectrum from the coupled Lamb wave resonator filter, c is an acoustic propagation speed of Lamb waves, $\lambda_c$ is a wavelength corresponding to a required central frequency at the filter output, and k is a non-zero natural integer number.

7. A coupled Lamb wave resonator filter according to claim 1, wherein a length of at least one of said first and second resonant layers is equal to about $$\frac{k\lambda_c}{2},$$

where $$f_c = \frac{c}{\lambda_c}$$

is a central frequency of an output spectrum from the coupled Lamb wave resonator filter, c is an acoustic propagation speed of Lamb waves, $\lambda_c$ is a wavelength corresponding to a required central frequency at the filter output, and k is a non-zero natural integer number.

8. A coupled Lamb wave resonator filter according to claim 1, wherein a length of at least one of said first and second resonant layers is different from lengths of at least one of said first, second, third and fourth electrodes.

9. A coupled Lamb wave resonator filter according to claim 1, wherein at least a portion of said periodic lattice comprises a resonant material.

10. A coupled Lamb wave resonator filter according to claim 9, wherein said resonant material has a length equal to about $$\frac{(2m+1)\lambda_c}{4},$$

where $$f_c = \frac{c}{\lambda_c}$$

is a central frequency of an output spectrum from the coupled Lamb wave resonator filter, c is an acoustic propagation speed of Lamb waves, $\lambda_c$ is a wavelength corresponding to a required central frequency at the filter output, where m is a natural non-zero integer number;

said resonant material being arranged between m pairs of metal areas with a length of about $$\frac{\lambda_c}{4},$$

and metal areas of each of said m pairs being aligned one above the other, and all of the metal areas of said m pairs located on the same side of said resonant material are separated from each other and from said first, second, third or fourth electrodes of said first and second Lamb wave resonators by a distance equal to about $$\frac{\lambda_c}{4}.$$

11. A coupled Lamb wave resonator filter according to claim 9, wherein said resonant material is arranged between metal areas, and wherein all of said first, second, third, and fourth electrodes, and all of said metal areas that are located on one side of said resonant material are all electrically connected together.

12. A coupled Lamb wave resonator filter according to claim 1, further comprising:
a third Lamb wave resonator comprising at least a third resonant layer, and at least fifth and sixth electrodes on opposite sides of said third resonant layer; and
an acoustic coupler for acoustically coupling at least one of said first and second Lamb wave resonators to said third Lamb wave resonator.

13. A coupled Lamb wave resonator filter according to claim 12, wherein said acoustic coupler comprises a second periodic lattice, and at least a portion of said second periodic lattice comprising a resonant material.

14. A coupled Lamb wave resonator filter according to claim 12, wherein said first, second and third resonant layers form a contiguous single layer.

15. A coupled Lamb wave resonator filter according to claim 1, further comprising at least one Bragg mirror acoustically coupled to one of said first and second Lamb wave resonators, and one of said first and second Lamb wave resonators being arranged between said at least one Bragg mirror and the other one of said first and second Lamb wave resonators.

16. A coupled Lamb wave resonator filter according to claim 15, wherein said at least one Bragg mirror comprises at least one layer of resonant material with a length equal to about $$\frac{n\lambda_c}{4},$$

where $$f_c = \frac{c}{\lambda_c}$$

is a central frequency of an output spectrum from the coupled Lamb wave resonator filter, c is an acoustic propagation speed of Lamb waves, $\lambda_c$ is a wavelength corresponding to a required central frequency at the filter output, where n is a natural non-zero integer number;

said at least one layer of resonant material being arranged between n pairs of metal areas with a length of about $$\frac{\lambda_c}{4},$$

the two metal areas of each of said n pairs being aligned one above the other, and all of the metal areas of said n pairs located on the same face of said at least one layer of resonant material are separated from each other and from said first, second, third or fourth electrodes of said first and second Lamb wave resonators by a distance equal to about $$\frac{\lambda_c}{4}.$$

17. A coupled Lamb wave resonator filter according to claim 1, further comprising at least one Bragg mirror comprising a first resonant material, and said periodic lattice comprising a second resonant material, and portions of said first and second resonant material having alternating impedances.

18. A coupled Lamb wave resonator filter comprising:
at least one first Lamb wave resonator comprising a first resonant layer, and first and second electrodes on opposite sides of said first resonant layer;
at least one second Lamb wave resonator comprising a second resonant layer, and third and fourth electrodes on opposite sides of said second resonant layer;
at least one of the sides of said first resonant layer belonging to a plane parallel to a plane corresponding to one of the sides of said second resonant layer, with both planes passing between said third and fourth electrodes of said second Lamb wave resonator; and
an acoustic coupler between said first and second resonant layers, and comprising a resonant material arranged between m pairs of metal areas, with metal areas of each of said m airs being aligned one above the other, where m is a natural non-zero integer number.

19. A coupled Lamb wave resonator filter according to claim 18, wherein at least one of said first and second resonant layers comprises one of a piezoelectric material and an electrostrictive material.

20. A coupled Lamb wave resonator filter according to claim 18, wherein said first and second electrodes of said first Lamb wave resonator are separated, and are not electrically connected to said third and fourth electrodes of said second Lamb wave resonator.

21. A coupled Lamb wave resonator filter according to claim 18, wherein one of said first and second electrodes of said first Lamb wave resonator is electrically connected to one of said third and fourth electrodes of said second Lamb wave resonator.

22. A coupled Lamb wave resonator filter according to claim 18, wherein a length of at least one of said first and second resonant layers is different from lengths of at least one of said first, second, third and fourth electrodes.

23. A coupled Lamb wave resonator filter according to claim 18, wherein the metal areas located on the same side of said resonant material are electrically connected together.

24. A coupled Lamb wave resonator filter according to claim 18, further comprising:
   at least one Bragg mirror acoustically coupled to one of said first and second Lamb wave resonators, and one of said first and second Lamb wave resonators being arranged between said at least one Bragg mirror and the other one of said first and second Lamb wave resonators; and
   said at least one Bragg mirror comprising at least one layer of resonant material arranged between n pairs of metal areas, the two metal areas of each of said n pairs being aligned one above the other; and all of the metal areas of said m pairs located on the same side of said resonant material of said acoustic coupler being electrically connected together, where n is a natural non-zero integer number.

25. A coupled Lamb wave resonator filter according to claim 24, wherein said first resonant layer, said second resonant layer, and said resonant material of said acoustic coupler form a contiguous single layer.

26. A method for making a coupled Lamb wave resonator filter comprising:
   providing at least one first Lamb wave resonator comprising a first resonant layer, and first and second electrodes on opposite sides of the first resonant layer;
   providing at least one second Lamb wave resonator comprising a second resonant layer, and third and fourth electrodes on opposite sides of the second resonant layer;
   at least one of the sides of the first Lamb wave resonant layer belonging to a plane parallel to a plane corresponding to one of the sides of the second Lamb wave resonant layer, with both planes passing through the third and fourth electrodes of the second Lamb wave resonator; and
   providing a periodic lattice for acoustically coupling the first and second Lamb wave resonant layers.

27. A method according to claim 26, wherein at least one of the first and second resonant layers comprises one of a piezoelectric material and an electrostrictive material.

28. A method according to claim 26, wherein the first and second electrodes of the first Lamb wave resonator are separated, and are not electrically connected to the third and fourth electrodes of the second Lamb wave resonator.

29. A method according to claim 26, wherein one of the first and second electrodes of the first Lamb wave resonator is electrically connected to one of the third and fourth electrodes of the second Lamb wave resonator.

30. A method according to claim 26, wherein a length of at least one of the first and second resonant layers is different from lengths of at least one of the first, second, third and fourth electrodes.

31. A method according to claim 26, wherein at least a portion of the periodic lattice comprises a resonant material.

32. A method according to claim 31, wherein the resonant material is arranged between m pairs of metal areas, and metal areas of each of the m pairs being aligned one above the other, and all of the metal area of said m pairs located on the same side of the resonant material being electrically connected together, where m is a natural non-zero integer number.

33. A method according to claim 26, further comprising providing at least one Bragg mirror that is acoustically coupled to one of the first and second Lamb wave resonators, and one of the first and second Lamb wave resonators being arranged between the at least one Bragg mirror and the other one of the first and second Lamb wave resonators.

* * * * *

UNITED STATES PATENT AND TRADEMARK OFFICE
CERTIFICATE OF CORRECTION

PATENT NO. : 7,804,383 B2
APPLICATION NO. : 11/845268
DATED : September 28, 2010
INVENTOR(S) : Volatier et al.

Page 1 of 1

It is certified that error appears in the above-identified patent and that said Letters Patent is hereby corrected as shown below:

| | |
|---|---|
| Column 1, Line 33 | Delete "5,621,833" <br> Insert: --5,821,833-- |
| Column 1, Line 40 | Delete "become" <br> Insert: --becomes-- |
| Column 2, Line 17 | Delete: "or and may" <br> Insert: --or may-- |
| Column 16, Line 59 | Delete: "m airs" <br> Insert: --m pairs-- |
| Column 17, Line 27 | Delete: "n pairs" <br> Insert: --m pairs-- |
| Column 17, Line 28 | Delete: "n pairs" <br> Insert: --m pairs-- |
| Column 17, Line 32 | Delete: "where n" <br> Insert: --where m-- |

Signed and Sealed this
Twelfth Day of July, 2011

David J. Kappos
*Director of the United States Patent and Trademark Office*